(12) United States Patent
Jan et al.

(10) Patent No.: US 9,805,816 B2
(45) Date of Patent: Oct. 31, 2017

(54) IMPLEMENTATION OF A ONE TIME PROGRAMMABLE MEMORY USING A MRAM STACK DESIGN

(71) Applicant: Headway Technologies, Inc., Milpitas, CA (US)

(72) Inventors: Guenole Jan, San Jose, CA (US); Po-Kang Wang, Los Altos, CA (US); Yuan-Jen Lee, Fremont, CA (US); Jian Zhu, San Jose, CA (US); Huanlong Liu, Sunnyvale, CA (US)

(73) Assignee: Headway Technologies, Inc., Milpitas, CA (US)

( * ) Notice: Subject to any disclaimer, the term of this patent is extended or adjusted under 35 U.S.C. 154(b) by 0 days.

(21) Appl. No.: 15/078,182

(22) Filed: Mar. 23, 2016

(65) Prior Publication Data

US 2016/0293268 A1 Oct. 6, 2016

Related U.S. Application Data

(60) Provisional application No. 62/142,591, filed on Apr. 3, 2015.

(51) Int. Cl.
*G11C 11/00* (2006.01)
*G11C 17/18* (2006.01)
(Continued)

(52) U.S. Cl.
CPC ............ *G11C 17/18* (2013.01); *G11C 11/005* (2013.01); *G11C 11/161* (2013.01);
(Continued)

(58) Field of Classification Search
CPC . G11C 11/16; G11C 11/15; G11C 2211/5614; G11C 11/14
(Continued)

(56) References Cited

U.S. PATENT DOCUMENTS 7,239,537 B2   7/2007   DeBrosse et al.
8,693,273 B2   4/2014   Yuh et al.
(Continued)

OTHER PUBLICATIONS

PCT Search Report, International applicaton No. PCT/US2016/024236, Applicant: Headway Technologies, Inc., dated Jun. 30, 2016, 16 pgs.
(Continued)

*Primary Examiner* — Huan Hoang
(74) *Attorney, Agent, or Firm* — Saile Ackerman LLC; Stephen B. Ackerman; Billy Knowles

(57) ABSTRACT

An integrated circuit includes a magnetic OTP memory array formed of multiple magnetic OTP memory cells having an MTJ stack with a fixed magnetic layer, a tunnel barrier insulating layer, a free magnetic layer, and a second electrode. When a voltage is applied across the magnetic OTP memory cell, the resistance of the MTJ stack and the gating transistor form a voltage divider to apply a large voltage across the MTJ stack to breakdown the tunnel barrier to short the fixed layer to the free layer. The integrated circuit has multiple MRAM arrays configured such that each of the multiple MRAM arrays have performance and density criteria that match MOS transistor based memory including SRAM, DRAM, and flash memory. The integrated circuit may include a functional logic unit connected with the magnetic OTP memory arrays and the MRAM arrays for providing digital data storage.

52 Claims, 8 Drawing Sheets

(51) Int. Cl.
  *G11C 11/16* (2006.01)
  *G11C 11/409* (2006.01)
  *G11C 11/419* (2006.01)
  *G11C 17/02* (2006.01)
  *H01L 43/12* (2006.01)
  *G11C 17/16* (2006.01)
  *H01L 27/22* (2006.01)

(52) U.S. Cl.
  CPC ...... *G11C 11/1673* (2013.01); *G11C 11/1675* (2013.01); *G11C 11/409* (2013.01); *G11C 11/419* (2013.01); *G11C 17/02* (2013.01); *G11C 17/16* (2013.01); *H01L 43/12* (2013.01); *G11C 2213/71* (2013.01); *H01L 27/228* (2013.01)

(58) Field of Classification Search
  USPC .................................. 365/158, 171, 173
  See application file for complete search history.

(56) References Cited

U.S. PATENT DOCUMENTS

| | | | |
|---|---|---|---|
| 8,917,533 | B2 | 12/2014 | Chung |
| 2010/0328992 | A1 | 12/2010 | Kano et al. |
| 2013/0051133 | A1 | 2/2013 | Son et al. |
| 2013/0250673 | A1* | 9/2013 | Yang ............... G11C 11/16 365/158 |
| 2014/0063895 | A1 | 3/2014 | Li et al. |
| 2014/0071740 | A1 | 3/2014 | Kim et al. |
| 2014/0071741 | A1 | 3/2014 | Kim et al. |

OTHER PUBLICATIONS

"Demonstration of Chip Level Writability, Endurance and Data Retention of an Entire 8 MB STT-MRAM Array," by Y. J. Lee et al., 2013 International Symposium on VLSI Technology, Systems, and Applications (VLSI-TSA), Apr. 22-24, 2013, pp. 1-2.

"Demonstration of fully functiional 8Mb perpendicular STT-MRAM chips with sub-5ns writing for non-volatile embedded memories," by Guenole Jan et al., 2014 Symposium on VLSI Technology Digest of Technical Papers, Jun. 9-12, 2014, pp. 1-2.

"Dielectric breakdown of MgO magnetic tunnel junction," by D.V.Dimitrov et al., AIP Applied Physics Letters 94, 123110, Mar. 26, 2009, pp. 1-3.

"Degradation and breakdown characteristics of thin MgO dielectric layers," by Robert O'Connor et al., Journal of Applied Physics 107, 024501, Jan. 19, 2010, pp. 1-4.

Basic Linear Design, Hank Zumbahlen, Editor, Copyright 2007, Analog Devices, Inc., ISBN 0-916550-28-1, pp. 1.33-1.37.

"A High-density and High-speed 1T-4MTJ MRAM with Voltage Offset Self-Reference Sensing Scheme," by Hiroaki Tanizaki et al., IEEE Asian Solid-State Circuits Conference, Nov. 13-15, 2006, ASSCC 2006, pp. 303-306.

A novel sensing algorithm for Spin-Transfer-Torque magnetic RAM (STT-MRAM) by dynamic reference, by Yong-Sik Park et al., IEICE Electronics Express, vol. 9, No. 3, Feb. 10, 2012, pp. 153-159.

"Signal-Margin-Screening for Multi-MB MRAM," by H. Honigschmid et al., ISSCC 2006, Session 7, Non-Volatile Memory, 7.3, 2006 IEEE International Solid State Circuits Conference—Digest of Technical Papers, Feb. 6-9, 2006, pp. 467-476.

\* cited by examiner

IMPLEMENTATION OF A ONE TIME PROGRAMMABLE MEMORY USING A MRAM STACK DESIGN

This application claims benefit under 35 U.S.C. §119 to U.S. Provisional Patent Application Ser. No. 62/142,591, filed on Apr. 3, 2015, which is assigned to a common assignee, and is herein incorporated by reference in its entirety.

TECHNICAL FIELD

This disclosure relates generally to a magnetic random access memory (MRAM) cell incorporated in an array. More particularly, this disclosure relates to a one-time-programmable (OTP) MRAM cell embedded into an array with other multi-time-programmable MRAM types.

BACKGROUND

The rapid increase in capacity of on-chip memories in recent years has renewed the search for a universal embedded memory technology that combines fast read/write, low voltage operation, low power consumption, non volatility, infinite endurance and compatibility with CMOS processes. Spin-transfer torque magnetoresistive random access memories (STT-MRAM) have been recognized as promising candidates since their inception. The technology is innately non-volatile, and it has been shown that STT-MRAM cells based on perpendicularly magnetized Magnetic Tunnel Junction devices (PMA-MTJs) can be written at high speed with low power. FIG. 1 is a diagram of a cross section of a spin-torque-transfer magnetic tunnel junction device of the related art. "Demonstration of fully functional 8 Mb perpendicular STT-MRAM chips with sub-5 ns writing for non-volatile embedded memories," January, et al., Digest of Technical Papers of the 2014 Symposium on VLSI Technology (VLSI-Technology), pp. 1-2, June 2014, found Mar. 11, 2015 at: ieeexplore.ieee.org/stamp/stamp. jsp?tp=&arnumber=6894357&isnumber=6894335, describes a PMA-MTJ stack is based on an alloy of cobalt, iron and boron (CoFeB) free layer 20 sandwiched between a capping layer 15 and a magnesium oxide (MgO) tunnel barrier 25 providing the perpendicular anisotropy. The tunnel barrier 25 is formed on a reference layer or pinning layer 30 of the CoFeB alloy. The reference layer 30 is formed on a bottom electrode 35. The bottom electrode 35 is for external connection to external devices. A hard mask contact layer 10 is formed on the capping layer 15 and the top electrode 5 is formed on the hard mask contact layer 10.

Recent reports show that MTJ devices can be operated at sub-nanosecond switching times that is as fast as SRAM and that the MTJ device size can be smaller than 25 nm and cell size about 6 $F^2$ (minimum feature size for an integrated circuit technology). This cell size is as small as stand alone DRAM. Moreover, MTJ device is non-volatile (similar to Flash memory) and has much higher endurance than Flash memory. However, while MRAM is very versatile, it is challenging to design an MTJ stack that would excel in all performance requirements. One approach would be to use different stacks for different applications, but the cost of integration would increase dramatically.

SUMMARY

An object of this disclosure is to provide a magnetic one-time-programmable memory cell Another object of this disclosure is to provide a magnetic one-time-programmable memory array.

Further, another object of this disclosure is to provide an integrated circuit having a magnetic one-time-programmable memory array integrated with at least one other MRAM type.

To accomplish at least one of these objectives, a magnetic one-time-programmable memory cell consists of a magnetic tunnel junction (MTJ) stack serially connected with a gating metal oxide semiconductor (MOS) transistor. The MTJ stack has a fixed magnetic layer formed on a first electrode. A tunnel barrier insulating layer is formed on the fixed magnetic layer. A free magnetic layer is formed on the tunnel barrier insulating layer. A second electrode is then formed on the free magnetic layer. The thickness of the tunnel barrier is calculated to be equal to that of an MTJ stack of a read/write MRAM memory cell using standard operating voltages of approximately 1.5V. The diameter of the MTJ stack is chosen to be approximately 20% smaller such that the resistance of the MTJ stack is approximately 50% greater than the read/write MRAM memory cell. Thus when a voltage is applied across the magnetic one-time-programmable memory cell, the resistance of the MTJ stack and the gating transistor form a voltage divider such that the voltage across the MTJ stack is determined by the equation:

$$V_{MTJ} = V_{BL} \cdot \frac{1}{1+\frac{R_{MOST}}{R_{MTJ}}}$$

Where:
$V_{MTJ}$ is the voltage developed across the MTJ stack.
VBL is the voltage applied across the magnetic one-time-programmable memory cell.
$R_{MOST}$ is the resistance of the gating MOS transistor.
$R_{MTJ}$ is the resistance of the MTJ stack.

The voltage $V_{MTJ}$ developed across the MTJ stack must be sufficiently large to cause breakdown of the tunnel barrier insulating layer. This breakdown causes the fixed magnetic layer and the free magnetic layer to short, thus programming the magnetic one-time-programmable memory cell to the low resistance state that is generally interpreted as binary "1" state.

The gating MOS transistor is equivalent to a gating MOS transistor of an MRAM memory cell. The drain of the gating MOS transistor is connected to the first electrode of the MTJ stack and the source of the gating MOS transistor provides a first connection to external circuitry. The gate of the gating MOS transistor provides a second connection to external circuitry. The second electrode of the magnetic one-time-programmable memory cell provides a third connection to external circuitry.

In other embodiments that accomplish at least one of the objectives, a magnetic one-time-programmable memory array has multiple magnetic one-time-programmable memory cells arranged in rows and columns. The columns of the magnetic one-time-programmable memory cells are connected to a pair of bit lines. A first of the pair of bit lines is connected to the second electrode of the MTJ stack of the magnetic one-time-programmable memory cells of an associated column of the array. The second of the pair of bit lines is connected to the source of the gating MOS transistor of the magnetic one-time-programmable memory cells of the associated column of the array. The gates of gating MOS transistor of each row of the magnetic one-time-programmable memory cells is connected to a word line associated with each row of the magnetic one-time-programmable memory cells.

The magnetic one-time-programmable memory array has a column decoder is connected to the pairs of bit lines linked with the columns of the magnetic one-time-programmable memory cells. The column decoder applies the voltage across to selected columns of the magnetic one-time-programmable memory cells for selectively programming the magnetic one-time-programmable memory cells on the selected row. A row decoder is connected to the word lines that are joined to each of the rows of the magnetic one-time-programmable memory cells. The row decoder activates the gating MOS transistor for one selected row for reading and writing the selected magnetic one-time-programmable memory cells.

The column decoder further includes a sense amplifier that receives read currents when a read voltage is applied to the pairs of bit lines for determining the digital data as programmed into the magnetic one-time-programmable memory array. The magnetic one-time-programmable memory array has at least two columns of magnetic one-time-programmable memory cells that function as reference cells to provide a reference voltage for the sense amplifier. One column of the reference magnetic one-time-programmable memory cells is programmed to have the low resistance of a programmed magnetic one-time-programmable memory cell and the second column has the high resistance of the un-programmed magnetic one-time-programmable memory cell. The current of the two columns is combined such that a reference voltage is provided for the sense amplifier.

In still other embodiments that accomplish at least one of the objectives, an integrated circuit constructed on a semiconductor substrate having at least one magnetic one-time-programmable memory array and at least one magnetic random access memory array. The at least one magnetic random access memory array is formed of magnetic one-time-programmable memory cells arranged in rows and columns. Each of the magnetic one time programmable cells has an MTJ stack serially connected with a gating MOS transistor structured identically to that of the magnetic one-time-programmable memory cell of the magnetic one time programmable cell. The MTJ stack of the magnetic random access memory cell has a larger area and thus a larger cell size than the magnetic one time programmable cell. The area of the MTJ stack of the magnetic random access memory cell is chosen to be approximately 20% larger in diameter than the magnetic one-time-programmable memory cell such that the resistance of the MTJ stack is approximately 50% smaller than the magnetic one-time-programmable memory cell.

In various embodiments, the integrated circuit has multiple magnetic random access memory arrays configured such that each of the multiple magnetic random access memory arrays have performance and density criteria that match MOS transistor based memory such as a static random access memory (SRAM), a dynamic random access memory (DRAM), and flash memory. The performance criteria for these embodiments are a data transfer read and write time of less than 10 ns for the SRAM, of from 10 ns to approximately 100 ns for the DRAM, and greater than 100 ns for the flash memory. The density of the DRAM is very high with a cell area of approximately 0.03 $\mu m^2$ in current technology. The density of the SRAM is not a factor, but is made small (approximately 30 $\mu m^2$ in current technology) for the faster read and writes times. The flash memory being a nonvolatile memory must have a long retention of greater than 10 years or write/erase endurance of approximately 100,000 cycles, which requires a larger cell size of approximately 0.04 $\mu m^2$ in current technology).

In some embodiments, the integrated circuit has at least one functional logic unit such as a computer processor or analog signal processing circuits, or environmental sensing circuits for which the at least one magnetic one-time-programmable memory array and at least one magnetic random access memory array provides storage for data to be processed by the at least one other circuit function.

In still other embodiments that accomplish at least one of the objectives, a method for forming an integrated circuit constructed on a semiconductor substrate. At least one magnetic one-time-programmable memory array is fabricated on the substrate. The at least one magnetic one-time-programmable memory array is fabricated by forming multiple magnetic one-time-programmable memory cells arranged in rows and columns. The columns of the magnetic one-time-programmable memory cells are connected to a pair of bit lines. A first of the pair of bit lines is connected to the second electrode of the MTJ stack of the magnetic one-time-programmable memory cells of an associated column of the array. The second of the pair of bit lines is connected to the source of the gating MOS transistor of the magnetic one-time-programmable memory cells of the associated column of the array.

A column decoder is formed to be connected to the pairs of bit lines linked with the columns of the magnetic one-time-programmable memory cells. The column decoder is constructed to apply a voltage to selected columns of the magnetic one-time-programmable memory cells for selectively programming the magnetic one-time-programmable memory cells on the selected row. A row decoder formed to be connected to the word lines that are joined to each of the rows of the magnetic one-time-programmable memory cells. The row decoder activates the gating MOS transistor for one selected row for reading and writing the selected magnetic one-time-programmable memory cells.

At least one magnetic random access memory array is fabricated on the substrate. The at least one magnetic random access memory array is fabricated by forming magnetic random access memory cells arranged in rows and columns. Each of the magnetic one time programmable cells are formed of an MTJ stack serially connected with a gating MOS transistor structured identically to that of the magnetic one-time-programmable memory cell of the magnetic one time programmable cell. The MTJ stack of the magnetic random access memory cell is formed with a larger area and thus a larger cell size than the magnetic one time programmable cell. The area of the MTJ stack of the magnetic random access memory cell is chosen to be approximately 20% larger in diameter than the magnetic one-time-programmable memory cell such that the resistance of the MTJ stack is approximately 50% smaller than the magnetic one-time-programmable memory cell.

In various embodiments, the integrated circuit is fabricated with multiple magnetic random access memory arrays configured such that each of the multiple magnetic random access memory arrays have performance and density criteria that match MOS transistor based memory such as a static random access memory (SRAM), a dynamic random access memory (DRAM), and flash memory. The performance criteria for these embodiments are a data transfer read and write time of less than 10 ns for the SRAM, of from 10 ns to approximately 100 ns for the DRAM, and greater than 100 ns for the flash memory. The density of the DRAM is very high with a cell area of approximately 0.03 µm² in current technology. The density of the SRAM is not a factor, but is made small (approximately 0.03 µm² in current technology) for the faster read and write times. The flash memory being a nonvolatile memory must have a long retention of greater than 10 years or write/erase endurance of approximately 100,000 cycles, which requires a larger cell size of approximately 0.04 µm² in current technology.

In some embodiments, the integrated circuit is fabricated to have at least one functional logic unit such as a computer processor, analog signal processing circuits, environmental sensing circuits, etc. The at least one magnetic one-time-programmable memory array and at least one magnetic random access memory array are fabricated to be connected to the at least one other circuit functions for providing storage for data to be processed by the at least one other circuit function.

In various embodiments, a magnetic one-time-programmable memory cell consists of a magnetic tunnel junction (MTJ) stack serially connected with a gating metal oxide semiconductor (MOS) transistor. The MTJ stack has a free magnetic layer formed on a first electrode. A tunnel barrier insulating layer is formed on the free magnetic layer. A fixed magnetic layer is formed on the tunnel barrier insulating layer. A second electrode is then formed on the fixed magnetic layer. The thickness of the tunnel barrier is calculated to be equal to that of an MTJ stack of a read/write MRAM memory cell using standard operating voltages of approximately 1.5V. The diameter of the MTJ stack is chosen to be approximately 20% smaller such that the resistance of the MTJ stack is approximately 50% greater than read/write MRAM memory cell. Thus when a voltage is applied across the magnetic one-time-programmable memory cell, the resistance of the MTJ stack and the gating transistor form a voltage divider such that the voltage across the MTJ stack is determined as described above. The drain of the gating MOS transistor is connected to the first electrode of the MTJ stack and the source of the gating MOS transistor provides a first connection to external circuitry. The gate of the gating MOS transistor provides a second connection to external circuitry. The second electrode of the magnetic one-time-programmable memory cell provides a third connection to external circuitry. The structure is essentially identical to that of the MRAM memory cell as above described with the exception that the MTJ stack is inverted.

DETAILED DESCRIPTION

Figure 2B:
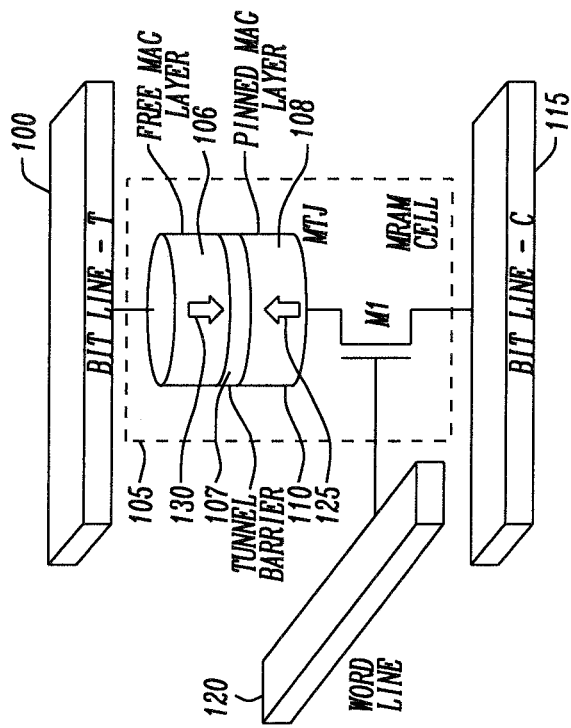
FIGS. 2a, 2b, 2c, and 2d are diagrams of a magnetic random access memory cell embodying the principles of the present disclosure.
Figure 2A:
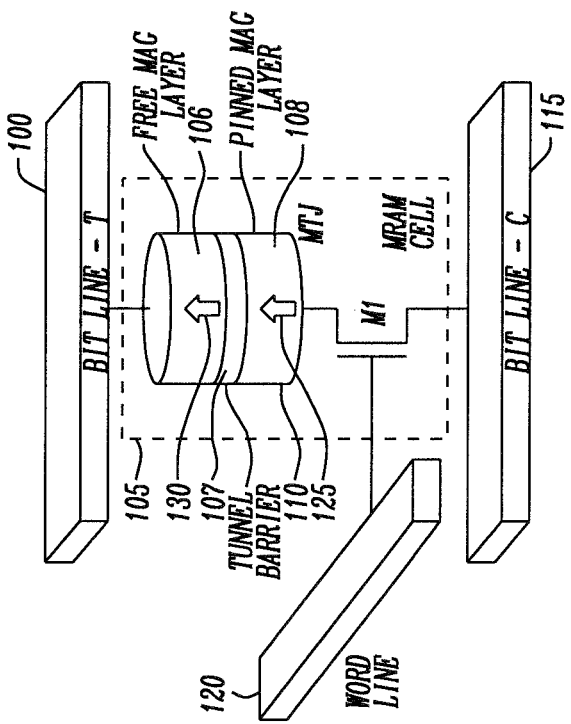

To meet the requirements of an integrated circuit having at least one array of magnetic one-time-programmable memory cells and at least one array of MRAM cells integrated with a digital and/or analog functional circuit block, a single MTJ stack and a gating MOS transistor is constructed to achieve the at least two distinct types of memory. The MTJ stack would be optimized for its main application (be it fast working memory, high density storage, or long data retention memory) and the gating MOS transistor to be identical is basic layout for the magnetic memory cell types. FIGS. 2a, 2b, 2c, and 2d are diagrams of a magnetic random access memory cells. In FIGS. 2a and 2b, an MRAM cell 105 has an MTJ stack 110 connected in series with a gating MOS transistor M1. A first electrode connects the free magnetic layer 106 of the MTJ stack 110 with a true bit line 100. The true bit line 100 connects the MRAM cell 105 to a column decoder (not shown) that provides the necessary voltage and current signals for selecting and operating the MRAM cell 105.

Figure 1:
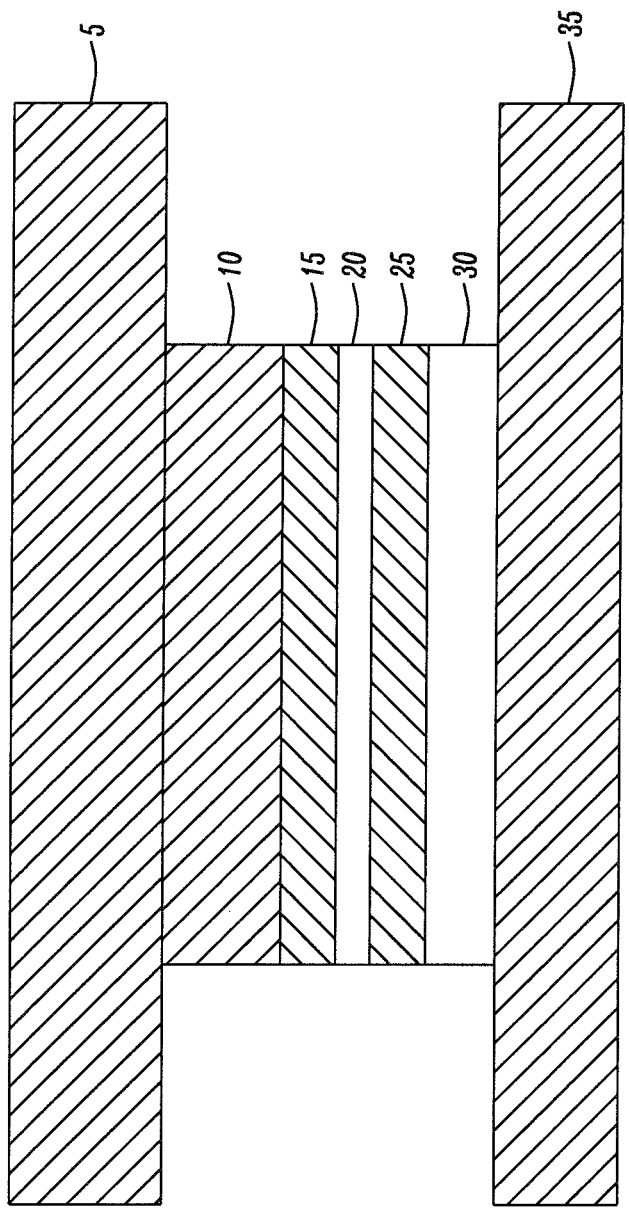
FIG. 1 is a diagram of a cross section of a spin-torque-transfer magnetic tunnel junction device of the related art.

The drain of the gating MOS transistor M1 is connected to a second electrode of the MTJ stack 110. The second electrode is further connected to the pinned magnetic layer 108. The tunnel barrier layer 107 is placed between the free magnetic layer 106 and the pinned magnetic layer 108. While this description is simplified, the structure is essentially identical to that of the MRAM cell of FIG. 1.

The source of the gating MOS transistor M1 is connected to the complementary bit line 115. The complementary bit line 115 is connected to the column decoder (not shown) that also provides the necessary voltage and current signals for selecting and operating the MRAM cell 105. The gate of the gating MOS transistor M1 is connected to a word line 120 associated with a row of the MRAM cells 105. The word line 120 is connected to a row decoder (not shown). The row decoder supplies a select signal to the gate of the gating MOS transistor M1 to activate or deactivate the gating MOS transistor M1 to select or deselect the MRAM cell 105 for writing or reading.

The pinned magnetic layer 108 has a fixed magnetic spin orientation 125 that is not affected by the write current through the MTJ stack 110. The free magnetic layer 106 has a selectable magnetic spin orientation 130 that is determined by the direction of the write current through the MTJ stack 110. FIG. 2a shows the parallel state of the MTJ stack 110 where the magnetic orientation of the free magnetic layer 106 and the pinned magnetic layer 108 are parallel or the same direction. This causes the resistance of the MTJ stack 110 to be low or have a digital state of a binary "0", since electrons preserve their spin orientation during the tunneling process and can only tunnel into the sub-band of the same spin orientation.

FIG. 2b shows the antiparallel state of the MTJ stack 110 where the magnetic orientation of the free magnetic layer 106 and the pinned magnetic layer 108 are in opposite directions or antiparallel. A change from the parallel magnetization configuration in FIG. 2a to the antiparallel configuration (FIG. 2b) of the two electrodes will result in an exchange between the two spin sub-bands of one of the electrodes for the tunneling process. The resistance then become relatively high or have a digital state or a binary "1".

Figure 2D:
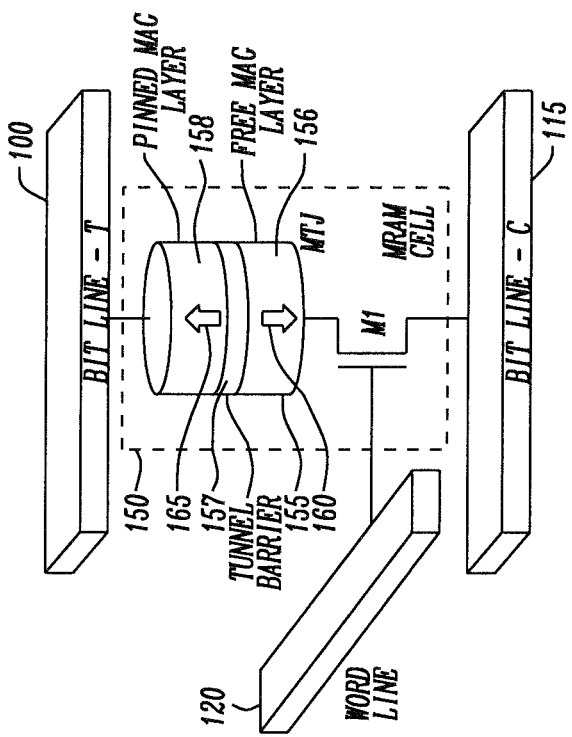
Figure 2C:
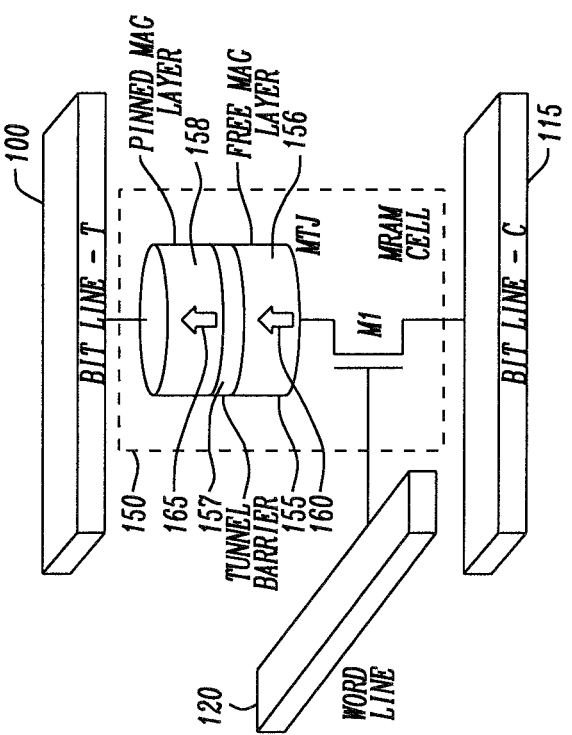

In FIGS. 2c and 2d, an MRAM cell 150 has an MTJ stack 155 connected in series with a gating MOS transistor M1. A first electrode connects the pinned magnetic layer 158 of the MTJ stack 155 with a true bit line 100. The true bit line 100 connects the MRAM cell 150 to a column decoder (not shown) that provides the necessary voltage and current signals for selecting and operating the MRAM cell 150.

The drain of the gating MOS transistor M1 is connected to a second electrode of the MTJ stack 155. The second electrode is further connected to the free magnetic layer 156. The tunnel barrier layer 157 is placed between the free magnetic layer 156 and the pinned magnetic layer 158. While this description is simplified, the structure is essentially identical to that of the MRAM cell of FIG. 1 with the exception that the MTJ stack 155 is inverted from that shown in FIG. 1.

The source of the gating MOS transistor M1 is connected to the complementary bit line 115. The complementary bit line 115 is connected to the column decoder (not shown) that also provides the necessary voltage and current signals for selecting and operating the MRAM cell 150. The gate of the gating MOS transistor M1 is connected to a word line 120 associated with a row of the MRAM cells 150. The word line 120 is connected to a row decoder (not shown). The row decoder supplies a select signal to the gate of the gating MOS transistor M1 to activate or deactivate the gating MOS transistor M1 to select or deselect the MRAM cell 150 for writing or reading.

The pinned magnetic layer 158 has a fixed magnetic spin orientation 165 that is not affected by the write current through the MTJ stack 155. The free magnetic layer 156 has a selectable magnetic spin orientation 130 that is determined by the direction of the write current through the MTJ stack 110. FIG. 2a shows the parallel state of the MTJ stack 110 where the magnetic orientation of the free magnetic layer 156 and the pinned magnetic layer 158 are parallel or the same direction. This causes the resistance of the MTJ stack 155 to be low or have a digital state of a binary "0", since electrons preserve their spin orientation during the tunneling process and can only tunnel into the sub-band of the same spin orientation.

FIG. 2d shows the antiparallel state of the MTJ stack 155 where the magnetic orientation of the free magnetic layer 156 and the pinned magnetic layer 158 are in opposite directions or antiparallel. A change from the parallel magnetization configuration in FIG. 2c to the antiparallel configuration (FIG. 2d) of the two electrodes will result in an exchange between the two spin sub-bands of one of the electrodes for the tunneling process. The resistance then become relatively high or have a digital state or a binary "1".

Figure 3:
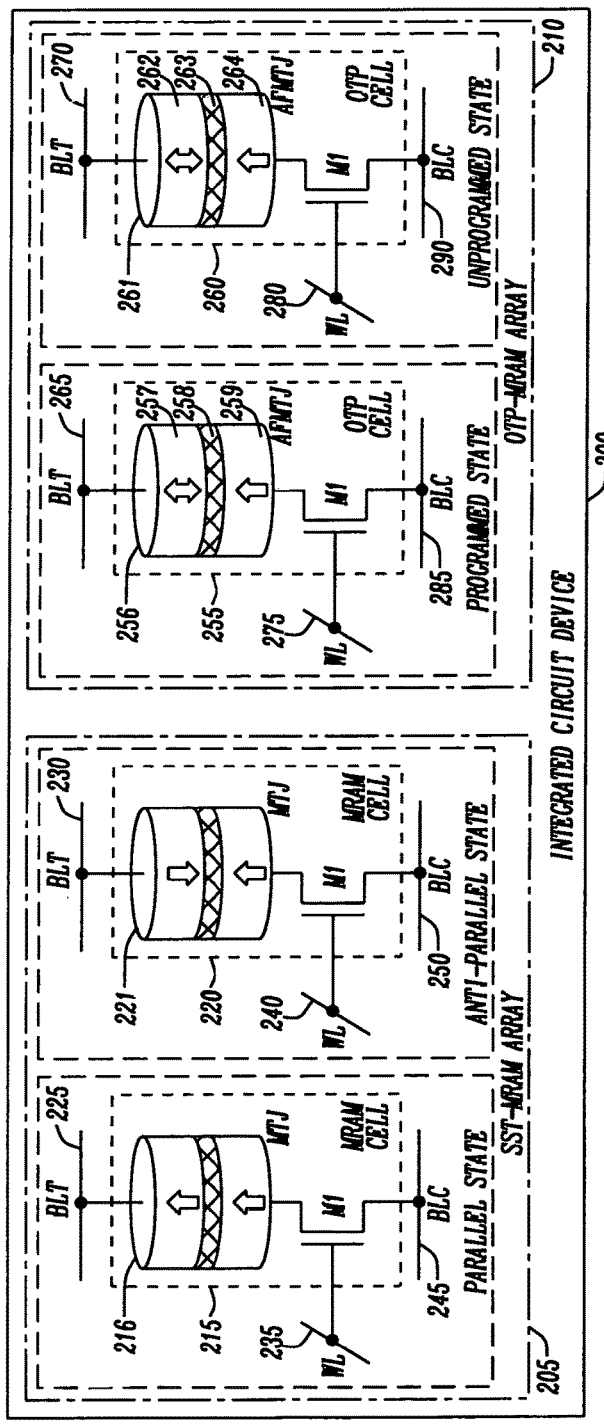
FIG. 3 is a diagram of an integrated circuit device having a magnetic random access memory array and a magnetic one-time-programmable memory array embodying the principles of the present disclosure.

FIG. 3 is a diagram of an integrated circuit device 200 having a magnetic random access memory array 205 and a magnetic one-time-programmable memory array 210 embodying the principles of the present disclosure. The integrated circuit device 200 has a spin-torque transfer MRAM 205 and a magnetic one-time programmable memory array 210. The spin-torque transfer MRAM 205 illustrates two columns of the MRAM cells 215 and 220. Each of the MRAM cells 215 and 220 are structured as shown as shown FIGS. 2a and 2b. The MRAM cell 215 is programmed as shown in FIG. 2a with the MRAM cell 215 being programmed in the parallel or binary "0" state. The MRAM cell 220 is programmed as shown in FIG. 2b with the MRAM cell 220 being programmed in the antiparallel or binary "1" state.

The true bit line 225 associated with the column containing the MRAM cell 215 is connected to the first electrode of the MTJ stack of the MRAM cell 215. The complement bit line 245 associated with the column containing the MRAM cell 215 is connected to the source of the gating MOS transistor M1. The word line 235 of the associated with the row containing the MRAM cell 215 is connected to the gate of the gating MOS transistor M1 of the MRAM cell 215. The true bit line 225 and the complement bit line 245 are connected to a column decoder (not shown) to provide the necessary voltage and current signals for selecting and operating the MRAM cell 215. The word line 235 is connected to a row decoder (not shown) for selecting the row containing the MRAM cell 215.

The true bit line 230 associated with the column containing the MRAM cell 220 is connected to the first electrode of the MTJ stack of the MRAM cell 220. The complement bit line 245 associated with the column containing the MRAM cell 215 is connected to the source of the gating MOS transistor M1. The word line 235 of the associated with the row containing the MRAM cell 220 is connected to the gate of the gating MOS transistor M1 of the MRAM cell 220. The true bit line 245 and the complement bit line 250 are connected to a row decoder (not shown) to provide the necessary voltage and current signals for selecting and operating the MRAM cell 215. The true bit line 225 and the complement bit line 245 are connected to a row decoder (not shown) to provide the necessary voltage and current signals for selecting and operating the MRAM cell 220. The word line 240 is connected to the row decoder for selecting the row containing the MRAM cell 220.

The one-time programmable memory array 210 illustrates two columns of the magnetic OTP memory cells 255 and 260. Each of the magnetic OTP memory cells 255 and 260 are structured as described for the MRAM cells as shown FIGS. 2a and 2b, except the anti-fuse MTJ stacks 256 and 261 each have a diameter that is chosen to be approximately 20% smaller such that the resistance of the anti-fuse MTJ stack 256 and 261 is approximately 50% greater than an MTJ stack of the read/write MRAM memory cell 215 or 220. Thus when a voltage is applied across the magnetic one-time-programmable memory cell, the resistance of the anti-fuse MTJ stack 256 and 261 and the gating transistor form a voltage divider such that the voltage across the anti-fuse MTJ stack 256 and 261 is sufficiently large to cause the tunnel barrier 258 or 263 to breakdown. The tunnel barriers 258 and 263 are formed between the free magnetic layer 257 and 262 and the fixed or pinned magnetic layer 259 and 264, respectively.

As described above, at breakdown the tunnel barrier tunnel barriers 258 and 263 form voids that allow the free magnetic layer 257 and 262 and the fixed or pinned magnetic layer 259 and 264 to short together. The magnetic OTP memory cell 255 illustrates a magnetic OTP memory cell that is in the programmed state with a very low resistance value that is essentially zero ohms. The magnetic OTP memory cell 260 illustrates a magnetic OTP memory cell that is in the un-programmed state where tunnel barrier 263 separates the free magnetic layer 262 from the fixed or pinned magnetic layer 264. The resistance is from approximately 3,600 ohms for an OTP memory cell 260 having an antiparallel magnetic orientation to approximately 7,200 ohms for an OTP memory cell 260 programmed in a parallel state.

Since the structure of the magnetic OTP memory cells 255 and 260 differs from the MRAM cells 215 and 220 only in the area of the anti-fuse MTJ stack 256 and 261 versus the MTJ stack of the MRAM cells 215 and 220, a single mask change (the mask that determines the size of the MTJ) is required to make the change. The single mask change increases the adaptability and versatility of the memory array.

Figure 4:
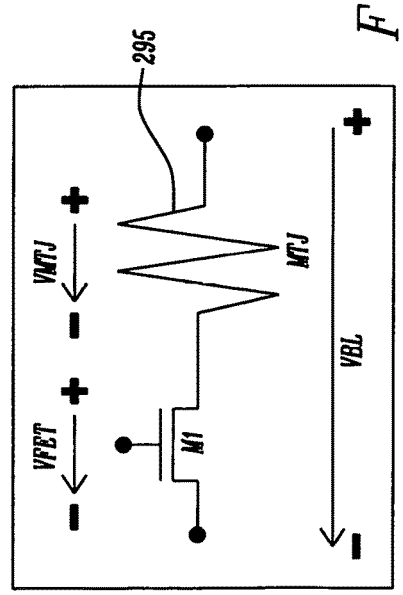
FIG. 4 is a schematic diagram of the magnetic random access memory cell embodying the principles of the present invention.

FIG. 4 is a schematic diagram of the magnetic random access memory cell embodying the principles of the present disclosure. As shown, the MRAM cell is formed of the MTJ stack 295 that selectively structured as the MTJ stacks 216, 221, 256, and 261 of FIG. 3. The MTJ stack 295 is serially connected to the gating MOS transistor M1. As described in FIG. 3, the first electrode is connected to a true bit line BLT that is connected to a column decoder that generates a bit line voltage VBL. The source of the gating MOS transistor M1 is connected to a complementary bit line BLC that is connected also to the column decoder for providing a return path for the current of the bit line voltage VBL. The second electrode of the MTJ stack 295 is connected to the drain of the gating MOS transistor 295. The gate of the gating MOS transistor M1 is connected to the word line WL that is connected to a row decoder that generates the row select signals for selectively turning on the gating MOS transistor M1. When the MRAM cell is activated, the MTJ stack 295 and the gating MOS transistor 295 act as a voltage divider. The voltage across the MTJ stack is determined by the equation:

$$V_{MTJ} = V_{BL} \cdot \frac{1}{1 + \frac{R_{MOST}}{R_{MTJ}}}$$

Where:
$V_{MTJ}$ is the voltage developed across the MTJ stack 295.
VBL is the voltage applied across the magnetic one-time-programmable memory cell.
$R_{MOST}$ is the resistance of the gating MOS transistor M1.
$R_{MTJ}$ is the resistance of the MTJ stack 295.

The resistance of the MTJ stack 295, as is known, is a function of the area of the MTJ stack 295 and the magnetic orientation of the free magnetic layer relative to the fixed magnetic layer. If the free magnetic layer is parallel to the fixed magnetic layer of the MTJ stack 295, the resistance of the MTJ stack 295 is lower for the MRAM cell 215 of FIG. 3. If the free magnetic layer is antiparallel to the fixed magnetic layer of the MTJ stack 295, the resistance of the MTJ stack 295 is from approximately two to approximately three times higher resistance than the MTJ stack 215 for the MRAM cell 220 of FIG. 3. If the free magnetic layer is shorted to the fixed magnetic layer of the MTJ stack 295, the resistance of the MTJ stack 295 is essentially zero ohms for the MRAM cell 255 of FIG. 3. And if the free magnetic layer is not programmed or shorted to the fixed magnetic layer of the MTJ stack 295, the resistance of the MTJ stack 295 is much, much greater than the resistance of the gating MOS transistor M1 for the MRAM cell 215 for FIG. 3.

The MTJ stacks 215 and 220 are structured such that the voltage VMTJ developed across the MTJ stacks 215 and 220 is from approximately 40% to approximately 60% the bit line voltage VBL. The MTJ stacks 255 and 260 are structured such that the voltage VMTJ developed across the un-programmed MTJ stacks 255 and 260 is from approximately 80% to approximately 90% the bit line voltage VBL.

During a write operation, the write voltage for the MTJ stacks 215 and 220 will not effect the tunnel barriers of the MTJ stacks 215 and 220. However, with the same write voltage level set for the bit line voltage VBL and MTJ stacks 255 and 260 are un-programmed, the voltage across an un-programmed MTJ stacks 255 and 260 is sufficiently large that the tunnel barrier 263 will breakdown, thus programming the cell as shown in the MTJ stack 255.

Figure 5:
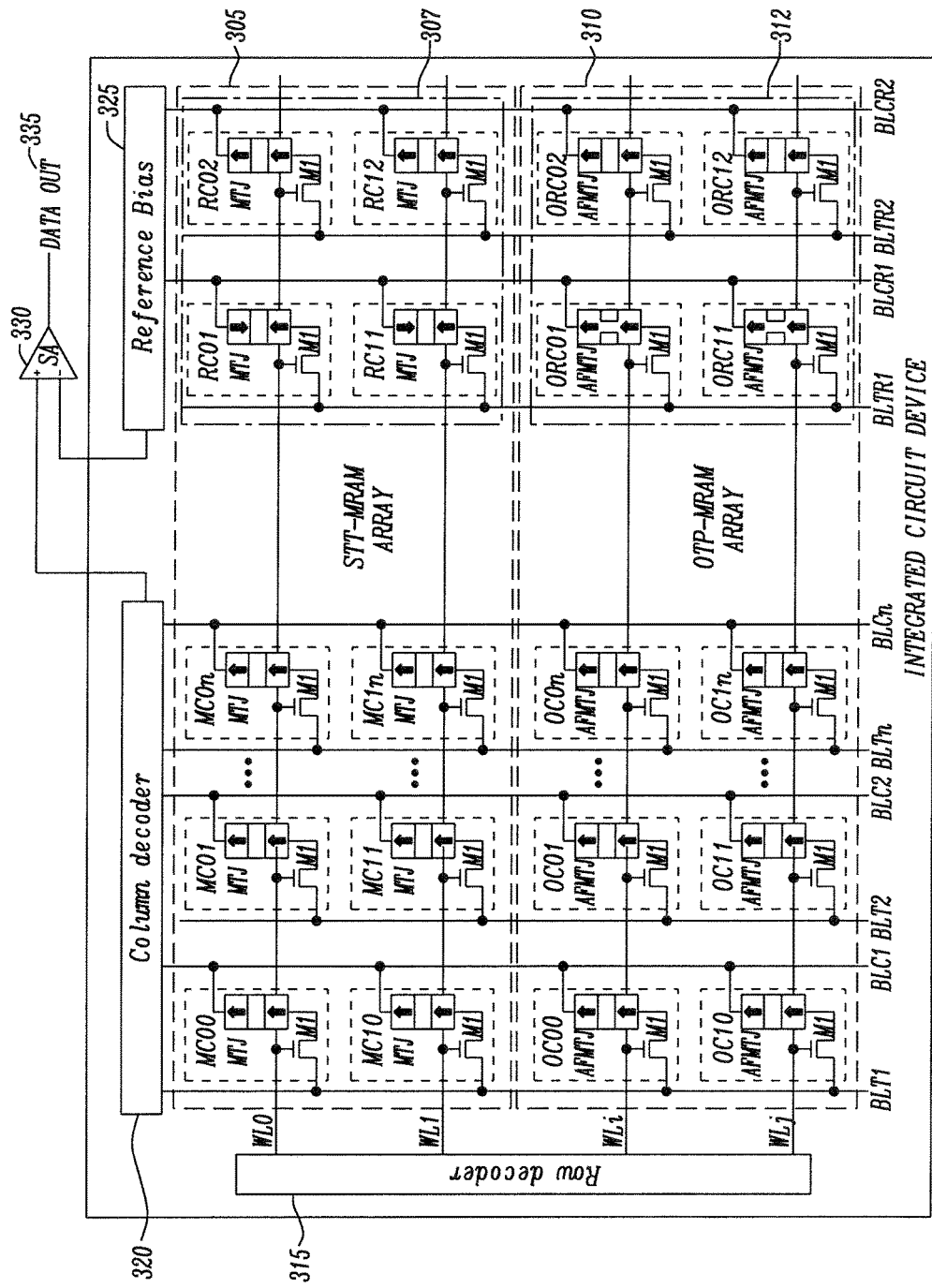
FIG. 5 is a schematic diagram of an integrated circuit device having a magnetic random access memory array integrated with a magnetic one-time-programmable memory array embodying the principles of the present disclosure.

FIG. 5 is a schematic diagram of an integrated circuit device 300 having a spin-torque transfer magnetic random access memory array 305 integrated with a magnetic one-time-programmable memory array 310 embodying the principles of the present disclosure. The STT-MRAM 305 includes multiple MRAM cells MC00, . . . , MC0n, MC10, . . . , MC1n arranged in rows and columns. Appended to each row of the MRAM cells MC00, . . . , MC0n, MC10, . . . , MC1n is a pair of reference MRAM cells RC01, . . . , RC02, RC11, . . . , RC12. Each of the columns of the MRAM cells MC00, . . . , MC0n, MC10, . . . , MC1n are connected to a pair of bit lines BLT1, BLC1, . . . , BLTn, BLCn. The pairs of bit lines BLT1, BLC1, . . . , BLTn, BLCn are connected to a column decoder 320 that generates the necessary write and read signals for programming and determining the digital contents of the MTJ stacks of the MRAM cells MC00, . . . , MC0n, MC10, . . . , MC1n.

Each of the rows of the MRAM cells MC00, . . . , MC0n, MC10, . . . , MC1n is connected to a word lines WL1, WL2 that are connected to a row decoder 315. The row decoder 315 generates the word line select signals that are applied to the word lines WL1, WL2 to select the rows of the STT-MRAM 305.

The pairs of reference MRAM cells RC01, . . . , RC02, RC11, . . . , RC1 on each column are connected to a pair of true and complement bit lines BLTR1, BLCR1, BLTR2, BLCR2. The pair of true and complement bit lines BLTR1, BLCR1, BLTR2, BLCR2 are connected to the reference biasing circuit 325. The reference biasing circuit 325 generates the necessary signals for programming and reading the pairs of reference MRAM cells RC01, . . . , RC02, RC11, . . . , RC12. The pairs of reference MRAM cells RC01, . . . , RC02, RC11, . . . , RC12 are programmed such that one column of the pairs of reference MRAM cells RC01, RC11 are programmed to have an antiparallel magnetic orientation and the other column of the pairs of reference MRAM cells RC02, RC12 are programmed to have a parallel magnetic orientation.

The OTP MRAM 310 is formed of multiple magnetic OTP memory cells OC00, . . . , OC0n, OC10, . . . , OC1n arranged in rows and columns. Appended to each row of the magnetic OTP memory cells OC00, . . . , OC0n, OC10, . . . , OC1 is a pair of reference magnetic OTP memory cells ORC01, . . . , ORC02, ORC11, . . . , ORC12. Each column of the OTP memory cells OC00, . . . , OC0n, OC10, . . . , OC1 is connected to a pair of bit lines BLT1, BLC1, . . . , BLTn, BLCn that is connected to the column decoder 320 to receive the write and read signals for programming and determining the digital contents of the MTJ stacks of OTP memory cells OC00, . . . , OC0n, OC10, . . . , OC1.

Each of the rows of the OTP memory cells OC00, . . . , OC0n, OC10, . . . , OC1 is connected to a word lines WLi, WLj that are connected to a row decoder 315. The row decoder 315 generates the word line select signals that are applied to the word lines WLi, WLj to select the rows of the OTP-MRAM 310.

The pairs of reference magnetic OTP memory cells ORC01, ORC02, ORC11, ORC12 on each column are connected to the pairs of true and complement bit lines BLTR1, BLCR1, BLTR2, BLCR2. The pairs of true and complement bit lines BLTR1, BLCR1, BLTRn, BLCRn are connected to the reference biasing circuit 325. The reference biasing circuit 325 generates the necessary signals for programming and reading the pairs of reference magnetic OTP memory cells ORC01, ORC02, ORC11, ORC12. The pairs of reference magnetic OTP memory cells ORC01, ORC02, ORC11, ORC12 are programmed such that one column of the pairs of reference magnetic OTP memory cells ORC01, ORC11 are programmed to have the free magnetic layer shorted to the fixed magnetic thus have essentially a zero ohm resistance. The other column of the pairs of reference magnetic OTP memory cells ORC02, ORC12 are not programmed and have a relatively high resistance value.

During a read operation of the STT-MRAM 305 or the OTP-MRAM 310, the column decoder 320 and the reference bias circuit 325 generate the read signals to be applied to the pairs of bit lines BLT1, BLC1, . . . , BLTn, BLCn and pairs of true and complement bit lines BLTR1, BLCR1, . . . , BLTR2, BLCR2. The row decoder 315 activates one of the word lines WL0, WL1, WLi, WLj to select one row of the array of MRAM cells MC00, . . . , MC0n, MC10, . . . , MC1n with their appended pairs of reference MRAM cells RC01, . . . , RC02, RC11, . . . , RC12 or the OTP memory cells OC00, . . . , OC0n, OC10, . . . , OC1 with their appended reference OTP memory cells ORC01, ORC02, ORC11, ORC12.

The read signal applied to one of MRAM cells MC00, . . . , MC0n, MC10, . . . , MC1n the current is sensed by the column decoder 320 and applied to one terminal (+) of the sense amplifier 330. The read signal applied to the pair of reference OTP memory cells ORC01, ORC02, ORC11, ORC12 is sense by the reference bias circuit 325 and applied to the second terminal (−) of the sense amplifier 330. The sensed read signal applied to the pair of reference OTP memory cells ORC01, ORC02, ORC11, ORC12 becomes the reference voltage for the sense amplifier 330 to determine the data output 335 from the sense amplifier 330 that has been read from the selected MRAM cell MC00, . . . , MC0n, MC10, . . . , MC1n. While one sense amplifier 330 is shown, typically multiple sense amplifiers are used for determining the digital data stored in the selected row of the MRAM cells MC00, . . . , MC0n, MC10, . . . , MC1n.

Figure 6:
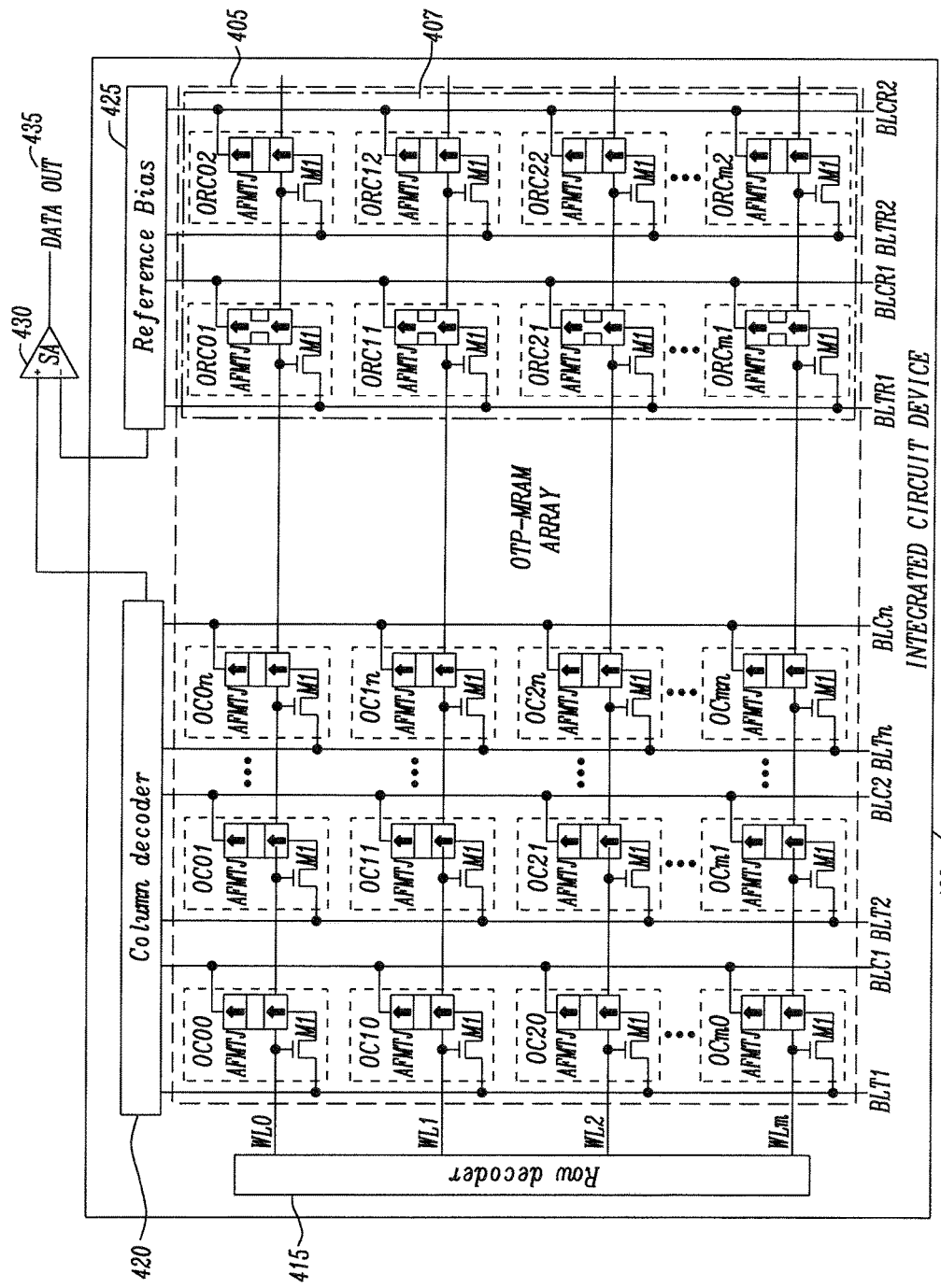
FIG. 6 is a schematic diagram of a magnetic one-time-programmable memory array embodying the principles of the present disclosure.

FIG. 6 is a schematic diagram of an integrated circuit device 400 having a magnetic OTP memory array 405 embodying the principles of the present disclosure. The magnetic OTP memory array 405 has multiple magnetic OTP cells OC00, . . . , OC0n, OC10, . . . , OC1n, . . . , OCm0, . . . , OCmn arranged in rows and columns. The multiple magnetic OTP memory cells OC00, . . . , OC0n, OC10, . . . , OC1n, . . . , OCm0, . . . , OCmn are constructed with an anti-fuse magnetic tunnel junction AFMTJ stack connected series with an gating MOS transistor M1 as described above. Appended to each of the rows of the multiple magnetic OTP memory cells OC00, . . . , OC0n, OC10, . . . , OC1n, . . . , OCm0, . . . , OCmn is a pair of reference magnetic OTP memory cells ORC01, ORC02, ORC11, ORC12, . . . , ORCm1, OCm2.

The columns of the multiple magnetic OTP memory cells OC00, . . . , OC0n, OC10, . . . , OC1n, . . . , OCm0, . . . , OCmn are connected to associated true and complement pairs of bit lines BLT1, BLC1, . . . , BLTn, BLCn. The true bit lines BLT1, . . . , BLTn are connected to the sources of the gating MOS transistors M1 and the complement bit lines BLC1, . . . , BLCn are connected the first electrode of the AFMTJ stacks. The true and complement pairs of bit lines BLT1, BLC1, . . . , BLTn, BLCn are connected to the column decoder 420 that generates the necessary write and read signals for programming and determining the digital contents of the AFMTJ stacks of the magnetic OTP memory cells OC00, . . . , OC0n, 0C10, . . . , OC1n, . . . , OCm0, . . . , OCmn.

The pairs of reference magnetic OTP memory cells ORC01, ORC02, ORC11, ORC12, . . . , ORCm1, OCm2 on each column are connected to the pairs of true and complement bit lines BLTR1, BLCR1, BLTR2, BLCR2. The pairs of true and complement bit lines BLTR1, BLCR1, BLTR2, BLCR2 are connected to the reference biasing circuit 425. The reference biasing circuit 425 generates the necessary signals for programming and reading the pairs of reference magnetic OTP memory cells ORC01, ORC02, ORC11, ORC12, . . . , ORCm1, OCm2. The pairs of reference magnetic OTP memory cells ORC01, ORC02, ORC11, ORC12, . . . , ORCm1, OCm2 are programmed such that one column of the pairs of reference magnetic OTP memory cells ORC01, ORC11, . . . , ORCm1 are programmed to have the free magnetic layer shorted to the fixed magnetic thus have essentially a zero ohm resistance. The other column of the pairs of reference magnetic OTP memory cells ORC02, ORC12, . . . , OCm2 are not programmed and have a relatively high resistance value.

During a read operation of the OTP-MRAM 310, the column decoder 420 and the reference bias circuit 325 generate the read signals to be applied to the pairs of bit lines BLT1, BLC1, . . . , BLTn, BLCn and pairs of true and complement bit lines BLTR1, BLCR1, BLTR2, BLCR2. The row decoder 415 activates one of the word lines WL0, WL1, WL2, . . . WLm to select one row of the array of the magnetic OTP memory cells OC00, . . . , OC0n, OC10, . . . , OC1n, . . . , OCm0, . . . , OCmn with their appended reference OTP memory cells ORC01, ORC11, . . . , ORCm1.

The read signal applied to one of magnetic OTP memory cells OC00, . . . , OC0n, OC10, . . . , OC1n, . . . , OCm0, . . . , OCmn the is sensed by the row decoder 320 and applied to one terminal (+) of the sense amplifier 430. The read signal applied to the pair of reference OTP memory cells ORC01, ORC11, . . . , ORCm1 is sense by the reference bias circuit 425 and applied to the second terminal (−) of the sense amplifier 430. The sensed read signal applied to the pair of reference OTP memory cells ORC01, ORC11, . . . , ORCm1 becomes the reference voltage for the sense amplifier 430 to determine the data output 435 from the sense amplifier 430 that has been read from the selected magnetic OTP memory cells OC00, . . . , OC0n, OC10, . . . , OC1, . . . , OCm0, . . . , OCmn. While one sense amplifier 430 is shown, typically multiple sense amplifiers are used for determining the digital data stored in the selected row of the magnetic OTP memory cells OC00, . . . , OC0n, OC10, . . . , OC1n, . . . , OCm0, . . . , OCmn.

Figure 7:
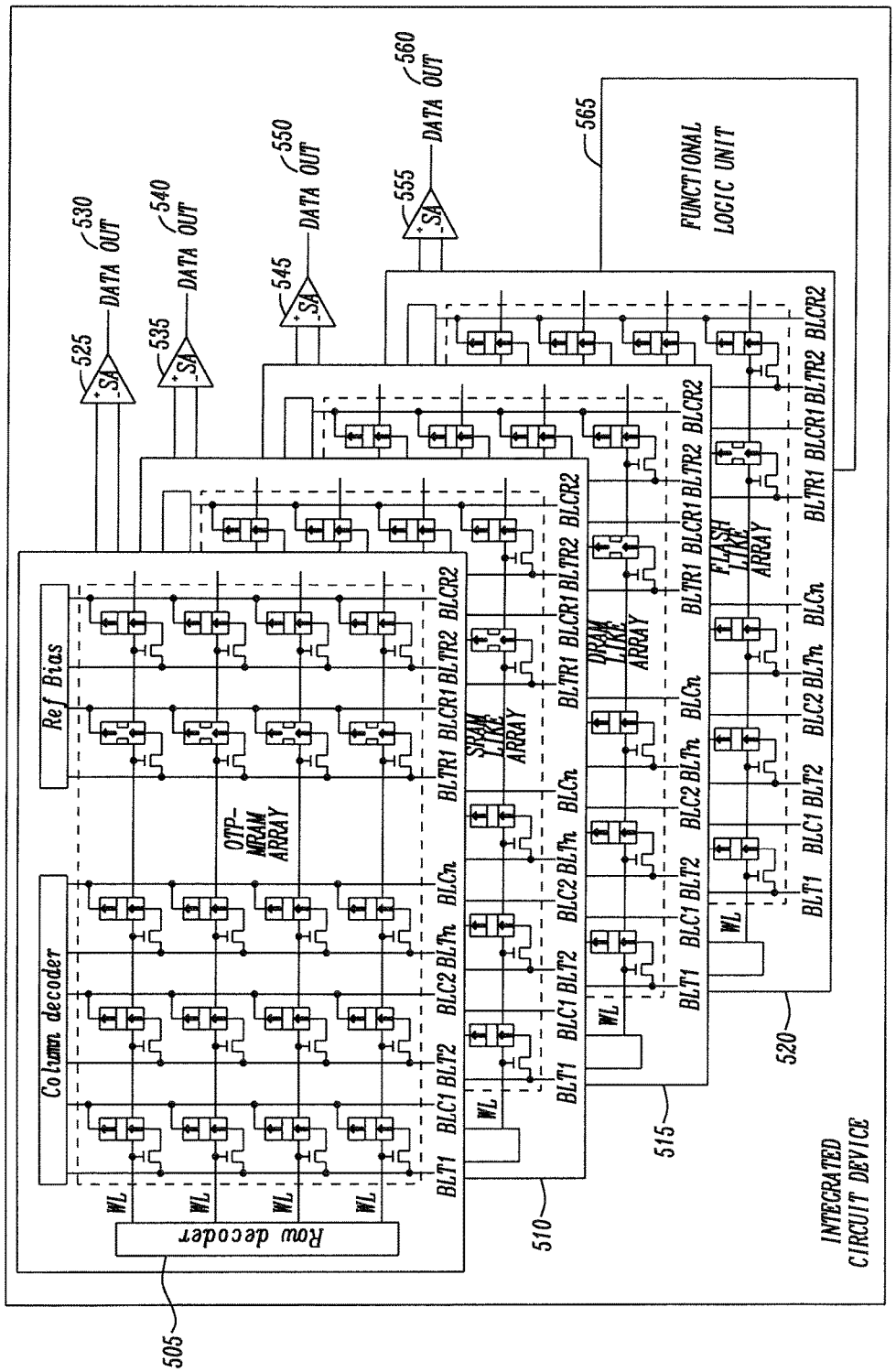
FIG. 7 is a schematic diagram of an integrated circuit device having a magnetic one-time-programmable memory array and multiple magnetic random access memory arrays embodying the principles of the present disclosure.

FIG. 7 is a schematic diagram of an integrated circuit device 500 having a magnetic one-time-programmable memory array 505 and multiple spin-torque transfer magnetic random access memory arrays 510, 515, 520 embodying the principles of the present disclosure. The magnetic one-time-programmable memory array 505 is structured and functions as described above for the magnetic one-time-programmable memory array 405 of FIG. 6. The STT-MRAMs 510, 515, 520 are structured and function as described as shown for the STT-MRAM 305 in FIG. 5. The differences between each of the STT-MRAMs 510, 515, 520 is in the diameter of the MTJ stack of each or the STT-MRAMs 510, 515, 520 to have a performance criteria for a MOS SRAM.

In the SRAM-like STT-MRAM 510, the MTJ stack has a diameter that is sufficiently small that the read and write speeds approach that of a MOS SRAM or less than 10 ns in the present day MOS SRAM devices. The size of the MRAM cell is determines the performance of the SRAM-like STT-MRAM 510 and would therefore be less than approximately 0.03 µm$^2$. In the DRAM-like STT-MRAM 515, the density is the primary concern with the cell area of approximately 0.03 µm$^2$. The read access and write time of the DRAM-like STT-MRAM must be from 10 ns to approximately 100 ns. In the Flash RAM-like STT-MRAM 520, the endurance is the critical performance criteria. For an STT-MRAM cell to have a data retention of greater than 10 years and write/erase endurance of approximately 100,000 cycles, the STT-MRAM cell has a cell size of approximately 0.04 µm$^2$.

The integrated circuit device 500 further includes a functional logic unit 565. The functional logic unit 565 may incorporate a computer processor, analog signal processing circuits, environmental sensing circuits, etc. The magnetic OTP memory array 505 and STT-MRAMs 510, 515, 520 are fabricated to be connected to the functional logic unit 565 for providing storage for data to be processed by the functional logic unit 565.

The output(s) of the magnetic OTP memory array 505 are connected to a sense amplifier 535. The sense amplifier 525 determines the data output from selected magnetic OTP memory cells and transfers the data output 530 either to the functional logic unit 565 or to external circuitry for processing. Similarly, the output(s) of the STT-MRAMs 510, 515, 520 are respectively connected to the sense amplifiers 535, 545, and 555. The sense amplifier 535, 545, and 55 determine the data output from selected STT-MRAM cells of the respective STT-MRAMs 510, 515, 520 and transfers the data outputs 540, 550, and 560 either to the functional logic unit 565 or to external circuitry for processing.

Figure 8:
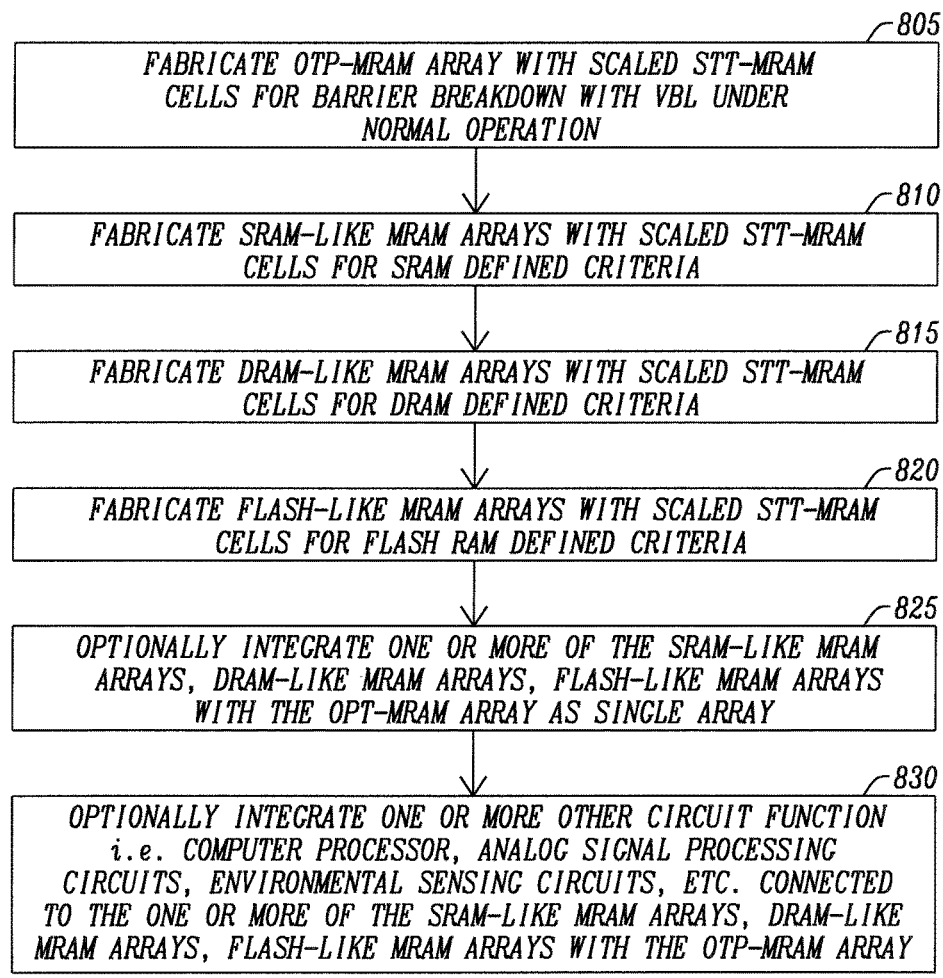
FIG. 8 is a flowchart of a method for fabricating and integrating circuit device embodying the principles of this disclosure.

FIG. 8 is a flowchart of a method for fabricating and integrating circuit device embodying the principles of this disclosure. The integrated circuit device is structured as described for FIG. 7 and is fabricated to have at least one magnetic OTP memory cell and at least one STT-MRAM with the at least one STT-MRAM being an SRAM-like STT-MRAM, a DRAM-like STT-MRAM, or a flash RAM-like STT-MRAM. An OTP-MRAM is fabricated (Box 805). The size of the OTP-MTJ stack is scaled down from the STT-MRAM cells such that the tunnel barrier breaks down with the bit line voltage VBL being the normal operation voltage for STT-MRAM cells as described above for FIG. 3.

An SRAM-like STT-MRAM is fabricated (Box 810). The size of the SRAM-like MTJ cell is scaled down from the STT-MRAM cells to approximately 0.03 m$^2$ such that the write and read times from are less than 10 ns with the bit line voltage VBL being the normal operation voltage for STT-MRAM cells as described above for FIG. 3. A DRAM-like STT-MRAM is fabricated (Box 815). The size of the DRAM-like MTJ cell provides the very high density of a MOS DRAM cell of approximately 0.03 µm$^2$. The performance to match the MOS DRAM cell must be from 10 ns to approximately 100 ns.

A Flash RAM-like STT-MRAM is fabricated (Box 820). The size of the Flash RAM-like MTJ cell is scaled to be greater than the STT-MRAM cells to be more than approximately 0.04 µm$^2$ such that the retention is greater than 10 years and the write/erase endurance is approximately 100,000 cycles. Optionally if there is a requirement that multiple types of the OTP-MRAM cells, the SRAM-like STT-MRAM cells, the DRAM-like STT-MRAM cells, and the Flash RAM-like STT-MRAM cells to be combined into a single array, the single mask change between the cell types permits fabricating (Box 825) any of the of the OTP-MRAM cells, the SRAM-like STT-MRAM cells, the DRAM-like STT-MRAM cells, and the Flash RAM-like STT-MRAM cells as a single array.

Optionally, one or more other functional logic unit is fabricated to incorporate circuits such as a computer processor, analog signal processing circuits, environmental sensing circuits, etc. to be connected to the one or more of the OTP-MRAM cells, the SRAM-like STT-MRAM cells, the DRAM-like STT-MRAM cells, and the Flash RAM-like STT-MRAM cells on a single substrate to form an integrated circuit device. The substrate of this integrated device is generally a silicon substrate, but is not restricted to strictly silicon substrates.

In summary, this disclosure provides for integrating multiple types of MRAM memory arrays that have the performance criteria to match or exceed MOS SRAM, MOS DRAM, MOS Flash RAM, and MOS one-time programmable RAM. These multiple types of memory are essentially based on the same STT-MRAM stack having a tunnel barrier. For the OTP MRAM cells, the OTP MRAM stack has a diameter such that the tunnel barrier dielectric breaks down with the voltage level for the SRAM-like, DRAM-like, and the Flash Ram-like STT-MRAM stacks. The OTP MRAM cells provide an ideal solution for code storage, trimming storage, encryption keys or any data that needs to be stored reliably for the entire life of the chip.

While this disclosure has been particularly shown and described with reference to the preferred embodiments thereof, it will be understood by those skilled in the art that various changes in form and details may be made without departing from the spirit and scope of the disclosure.

What is claimed is:

1. A magnetic one-time-programmable memory cell comprising:
    a magnetic tunnel junction (MTJ) device comprising a fixed magnetic layer fabricated on a first electrode, a tunnel barrier insulating layer fabricated upon the fixed magnetic layer, a free magnetic layer fabricated on the tunnel barrier insulating layer, and a second electrode fabricated on the free magnetic layer, wherein a diameter of the MTJ device is chosen such that the tunnel barrier insulating layer is broken down by a program voltage applied across the magnetic one-time-programmable memory cell that is approximately equal to a write voltage for a read/write MRAM memory cell having an equal tunnel barrier insulating layer thickness; and
    a gating metal oxide semiconductor (MOS) transistor serially connected to the MTJ device.

2. The magnetic one-time-programmable memory cell of claim 1 wherein the area of the MTJ device is chosen to be approximately 20% smaller in diameter such that the resistance of the MTJ device is approximately 50% greater than an MTJ device of the read/write MRAM memory cell.

3. The magnetic one-time-programmable memory cell of claim 1 wherein the program voltage is approximately 1.5V.

4. The magnetic one-time-programmable memory cell of claim 1 wherein when the program voltage is applied across the magnetic one-time-programmable memory cell, the resistance of the MTJ device and the gating transistor form a voltage divider such that the voltage across the MTJ device is determined by the equation:

$$V_{MTJ} = V_{BL} \cdot \frac{1}{1 + \frac{R_{MOST}}{R_{MTJ}}}$$

Where:

$V_{MTJ}$ is the voltage developed across the MTJ device,
VBL is the voltage applied across the magnetic one-time-programmable memory cell,
$R_{MOST}$ is the resistance of the gating MOS transistor, and
$R_{MTJ}$ is the resistance of the MTJ device.

5. The magnetic one-time-programmable memory cell of claim 1 wherein the breakdown of the tunnel barrier insulating layer causes the fixed magnetic layer and the free magnetic layer to short, thus programming the magnetic one-time-programmable memory cell to a low resistance state.

6. The magnetic one-time-programmable memory cell of claim 1 wherein a structure and size of the gating MOS transistor is equivalent to the structure and size of a gating MOS transistor of the read/write MRAM memory cell.

7. The magnetic one-time-programmable memory cell of claim 1 wherein the drain of the gating MOS transistor is connected to the first electrode of the MTJ device, a source of the gating MOS transistor provides a first connection to external circuitry, and a gate of the gating MOS transistor provides a second connection to external circuitry.

8. The magnetic one-time-programmable memory cell of claim 7 wherein the second electrode of the MTJ device provides a third connection to external circuitry.

9. A magnetic one-time-programmable memory array comprising:
a plurality of magnetic one-time-programmable memory cells arranged in rows and columns, each magnetic one-time-programmable memory cell comprising:
a magnetic tunnel junction (MTJ) device comprising a fixed magnetic layer fabricated on a first electrode, a tunnel barrier insulating layer fabricated upon the fixed magnetic layer, a free magnetic layer fabricated on the tunnel barrier insulating layer, and a second electrode fabricated on the free magnetic layer, wherein a diameter of the MTJ device is chosen such that the tunnel barrier insulating layer is broken down by a program voltage applied across the magnetic one-time-programmable memory cell that is approximately equal to a write voltage for a read/write MRAM memory cell having an equal tunnel barrier insulating layer thickness; and
a gating metal oxide semiconductor (MOS) transistor serially connected to the MTJ device;
a plurality of pairs of bit lines wherein a first bit line of the pairs of bit lines is connected to the second electrode of the MTJ device of the magnetic one-time-programmable memory cells of an associated column of the array, a second bit line of the pairs of bit lines is connected to the source of the gating MOS transistor of the magnetic one-time-programmable memory cells of the associated column of the array;
a plurality of word lines wherein each word line is associated with each row of the plurality of magnetic one-time-programmable memory cells such that the gates of gating MOS transistors of each row of the magnetic one-time-programmable memory cells is con-
nected to the word line associated with each row of the magnetic one-time-programmable memory cells.

10. The magnetic one-time-programmable memory array of claim 9 further comprising a column decoder connected to the pairs of bit lines linked with the columns of the magnetic one-time-programmable memory cells, wherein the column decoder applies the program voltage across to selected columns of the magnetic one-time-programmable memory cells for selectively programming the magnetic one-time-programmable memory cells on one selected row.

11. The magnetic one-time-programmable memory array of claim 9 further comprising a row decoder connected to the word lines that are joined to each of the rows of the magnetic one-time-programmable memory cells, wherein the row decoder activates the gating MOS transistor for one selected row for reading and writing the selected magnetic one-time-programmable memory cells.

12. The magnetic one-time-programmable memory array of claim 10 wherein the column decoder further comprises a sense amplifier that receives read currents when a read voltage is applied to the pairs of bit lines for determining the digital data as programmed into the magnetic one-time-programmable memory array.

13. The magnetic one-time-programmable memory array of claim 12 further comprises at least two columns of reference magnetic one-time-programmable memory cells that are programmed and connected to the column decoder to provide a reference voltage for the sense amplifier.

14. The magnetic one-time-programmable memory array of claim 13 wherein one column of the reference magnetic one-time-programmable memory cells is programmed to have a low resistance of a programmed magnetic one-time-programmable memory cell and a second column has the high resistance of the un-programmed magnetic one-time-programmable memory cell, wherein a current of the two columns is combined such that a reference voltage is provided for the sense amplifier.

15. An integrated circuit constructed on a semiconductor substrate comprising:
at least one magnetic one-time-programmable memory array comprising:
a plurality of magnetic one-time-programmable memory cells arranged in rows and columns, wherein each magnetic one-time-programmable memory cell comprises:
a magnetic tunnel junction (MTJ) device comprising a fixed magnetic layer fabricated on a first electrode, a tunnel barrier insulating layer fabricated upon the fixed magnetic layer, a free magnetic layer fabricated on the tunnel barrier insulating layer, and a second electrode fabricated on the free magnetic layer, wherein a diameter of the MTJ device is chosen such that the tunnel barrier insulating layer is broken down by a program voltage applied across the magnetic one-time-programmable memory cell that approximately equal to is a write voltage for a read/write MRAM memory cell having an equal tunnel barrier insulating layer thickness, and
a gating metal oxide semiconductor (MOS) transistor serially connected to the MTJ device,
a plurality of pairs of bit lines wherein a first bit line of the pairs of bit lines is connected to the second electrode of the MTJ device of the magnetic one-time-programmable memory cells of an associated column of the array, a second bit line of the pairs of bit lines is connected to the source of the gating MOS transistor of the magnetic one-time-programmable memory cells of the associated column of the array, and a plurality of word lines wherein each word line is associated with each row of the plurality of magnetic one-time-programmable memory cells such that the gates of gating MOS transistor of each row of the magnetic one-time-programmable memory cells is connected to the word line associated with each row of the magnetic one-time-programmable memory cells; and at least one magnetic random access memory (MRAM) array configured for having performance and density criteria that match MOS transistor based memory wherein MOS based transistor memory is a static random access memory (SRAM), a dynamic random access memory (DRAM), or flash memory.

16. The integrated circuit of claim 15 wherein the area of the MTJ device is chosen to be approximately 20% smaller in diameter such that the resistance of the MTJ device is approximately 50% greater than an MTJ device of the read/write MRAM memory cell.

17. The integrated circuit of claim 15 wherein the performance criteria for the MOS transistor based memory is a data transfer read and write time of less than 10 ns for the SRAM, of from 10 ns to approximately 100 ns for the DRAM, and greater than 100 ns for the flash memory; wherein the density of the DRAM is very high with a cell area of approximately 0.03 $\mu m^2$ and the density of the SRAM is not a factor, but is made small (approximately 0.03 $\mu m^2$) for the faster read and writes times; wherein the flash memory has a long retention of greater than 10 years or write/erase endurance of approximately 100,000 cycles, which requires a larger cell size of approximately 0.04 $\mu m^2$.

18. The integrated circuit of claim 15 further comprising at least one functional logic unit that is configured to be a computer processor or analog signal processing circuits, or environmental sensing circuits for which the at least one magnetic one-time-programmable memory array and at least one MRAM provides storage for data to be processed by the at least one functional logic unit.

19. A method for forming an integrated circuit constructed on a semiconductor substrate, comprising the steps of:
forming at least one magnetic one-time-programmable memory array is fabricated on the substrate by the steps of:
forming multiple magnetic one-time-programmable memory cells by the steps of:
forming a first magnetic tunnel junction (MTJ) device on the substrate by the steps of:
fabricating a fixed magnetic layer on a first electrode,
fabricating a tunnel barrier insulating layer upon the fixed magnetic layer,
fabricating a free magnetic layer on the tunnel barrier insulating layer, and
fabricating a second electrode on the free magnetic layer, wherein a diameter of the first MTJ device is chosen such that the tunnel barrier insulating layer is broken down by a program voltage applied across the magnetic one-time-programmable memory cell that approximately equal to is a write voltage for a read/write MRAM memory cell having an equal tunnel barrier insulating layer thickness, and
forming a gating metal oxide semiconductor (MOS) transistor on the substrate,
serially connecting the gating MOS transistor to the MTJ device,
arranging magnetic one-time-programmable memory cells in rows and columns,
forming a plurality of pairs of bit lines,
connecting a first bit line of one pair of bit lines to the second electrode of the first MTJ device of the magnetic one-time-programmable memory cells of an associated column of the array, and
connecting a second bit line of the one pair bit lines is connected to the source of the gating MOS transistor of the magnetic one-time-programmable memory cells of the associated column of the array.

20. The method for forming an integrated circuit of claim 19 wherein forming at least one magnetic one-time-programmable memory array further comprises the steps of:
forming a column decoder configured for applying a voltage to selected columns of the magnetic one-time-programmable memory cells for selectively programming the magnetic one-time-programmable memory cells on the selected row;
connecting the column decoder to the pairs of bit lines linked with the columns of the magnetic one-time-programmable memory cells;
forming a row decoder configured for activating the gating MOS transistors for one selected row for reading and writing the selected magnetic one-time-programmable memory cells; and
connecting the row decoder to the word lines that are joined to each of the rows of the magnetic one-time-programmable memory cells.

21. The method for forming an integrated circuit of claim 19 further comprising the steps of:
fabricating at least one magnetic random access memory array on the substrate by the steps of:
forming read/write MRAM memory cells arranged in rows and columns, wherein forming each of the read/write MRAM memory cells comprises the steps of:
forming a second MTJ device,
forming a gating MOS transistor configured to structurally identical to that of the magnetic one-time-programmable memory cell of the magnetic one time programmable cell, and
serially connecting the second MTJ device with the gating MOS transistor.

22. The method for forming an integrated circuit of claim 21 wherein forming the second MTJ device comprises the step of configuring the second MTJ device with a larger area and thus a larger cell size than the first MTJ device.

23. The method for forming an integrated circuit of claim 22 wherein the area of the second MTJ device of the magnetic random access memory cell is chosen to be approximately 20% larger in diameter than the first MTJ device such that the resistance of the MTJ device is approximately 50% smaller than the first MTJ device.

24. The method for forming an integrated circuit of claim 19 further comprising the steps of:
fabricating multiple magnetic random access memory arrays configured such that each of the multiple magnetic random access memory arrays have performance and density criteria that match MOS transistor based memory wherein MOS based transistor memory is a static random access memory (SRAM), a dynamic random access memory (DRAM), or flash memory.

25. The method for forming an integrated circuit of claim 24 wherein the performance criteria for the MOS transistor based memory is a data transfer read and write time of less than 10 ns for the SRAM, of from 10 ns to approximately 100 ns for the DRAM, and greater than 100 ns for the flash memory; wherein the density of the DRAM is very high with a cell area of approximately 0.03 µm² and the density of the SRAM is not a factor, but is made small (approximately 0.03 µm²) for the faster read and writes times; wherein the flash memory has a long retention of greater than 10 years or write/erase endurance of approximately 100,000 cycles, which requires a larger cell size of approximately 0.04 µm².

26. The method for forming an integrated circuit of claim 19 further comprising the steps of:
fabricating at least one functional logic unit that is configured to be a computer processor or analog signal processing circuits, or environmental sensing circuits for which the at least one magnetic one-time-programmable memory array and at least one MRAM provides storage for data to be processed by the at least one functional logic unit.

27. A magnetic one-time-programmable memory cell comprising:
a magnetic tunnel junction (MTJ) device comprising:
a free magnetic layer,
a fixed magnetic layer
a tunnel barrier insulating layer formed between the free magnetic layer and the tunnel barrier insulating layer, and
a pair of electrodes fabricated such that one electrode of the pair of electrodes is connected to the free magnetic layer and a second electrode is connected to the fixed magnetic layer,
wherein a diameter of the MTJ device is chosen such that the tunnel barrier insulating layer is broken down by a program voltage applied across the magnetic one-time-programmable memory cell that approximately equal to is a write voltage for a read/write MRAM memory cell having an equal tunnel barrier insulating layer thickness; and
a gating metal oxide semiconductor (MOS) transistor serially connected to the MTJ device.

28. The magnetic one-time-programmable memory cell of claim 27 wherein the area of the MTJ device is chosen to be approximately 20% smaller in diameter such that the resistance of the MTJ device is approximately 50% greater than an MTJ device of the read/write MRAM memory cell.

29. The magnetic one-time-programmable memory cell of claim 27 wherein the program voltage is approximately 1.5V.

30. The magnetic one-time-programmable memory cell of claim 27 wherein when the program voltage is applied across the magnetic one-time-programmable memory cell, the resistance of the MTJ device and the gating transistor form a voltage divider such that the voltage across the MTJ device is determined by the equation:

$$V_{MTJ} = V_{BL} \cdot \frac{1}{1 + \frac{R_{MOST}}{R_{MTJ}}}$$

Where:
$V_{MTJ}$ is the voltage developed across the MTJ device,
VBL is the voltage applied across the magnetic one-time-programmable memory cell,
$R_{MOST}$ is the resistance of the gating MOS transistor, and
$R_{MTJ}$ is the resistance of the MTJ device.

31. The magnetic one-time-programmable memory cell of claim 27 wherein the breakdown of the tunnel barrier insulating layer causes the fixed magnetic layer and the free magnetic layer to short, thus programming the magnetic one-time-programmable memory cell to a low resistance state.

32. The magnetic one-time-programmable memory cell of claim 27 wherein a structure and size of the gating MOS transistor is equivalent to the structure and size of a gating MOS transistor of the read/write MRAM memory cell.

33. The magnetic one-time-programmable memory cell of claim 27 wherein the drain of the gating MOS transistor is connected to the one electrode of the two electrodes of the MTJ device, a source of the gating MOS transistor provides a first connection to external circuitry, and a gate of the gating MOS transistor provides a second connection to external circuitry.

34. The magnetic one-time-programmable memory cell of claim 33 wherein another electrode of the pair of electrodes provides a third connection to external circuitry.

35. A magnetic one-time-programmable memory array comprising:
a plurality of magnetic one-time-programmable memory cells arranged in rows and columns, each magnetic one-time-programmable memory cell comprising;
a magnetic tunnel junction (MTJ) device comprising:
a free magnetic layer,
a fixed magnetic layer
a tunnel barrier insulating layer formed between the free magnetic layer and the tunnel barrier insulating layer, and
a pair of electrodes fabricated such that one electrode of the pair of electrodes is connected to the free magnetic layer and a second electrode is connected to the fixed magnetic layer,
wherein a diameter of the MTJ device is chosen such that the tunnel barrier insulating layer is broken down by a program voltage applied across the magnetic one-time-programmable memory cell that is approximately equal to a write voltage for a read/write MRAM memory cell having an equal tunnel barrier insulating layer thickness; and
a gating metal oxide semiconductor (MOS) transistor serially connected to the MTJ device such that a drain of the MOS transistor is connected to one of the two electrodes of the MTJ device;
a plurality of pairs of bit lines wherein a first bit line of the pairs of bit lines is connected to another electrode of the two electrodes of the MTJ device of the magnetic one-time-programmable memory cells of an associated column of the array, a second bit line of the pairs of bit lines is connected to the source of the gating MOS transistor of the magnetic one-time-programmable memory cells of the associated column of the array;
a plurality of word lines wherein each word line is associated with each row of the plurality of magnetic one-time-programmable memory cells such that the gates of gating MOS transistors of each row of the magnetic one-time-programmable memory cells is connected to the word line associated with each row of the magnetic one-time-programmable memory cells.

36. The magnetic one-time-programmable memory array of claim 35 further comprising a column decoder connected to the pairs of bit lines linked with the columns of the magnetic one-time-programmable memory cells, wherein the column decoder applies the program voltage across to selected columns of the magnetic one-time-programmable memory cells for selectively programming the magnetic one-time-programmable memory cells on one selected row.

37. The magnetic one-time-programmable memory array of claim 35 further comprising a row decoder connected to the word lines that are joined to each of the rows of the magnetic one-time-programmable memory cells, wherein the row decoder activates the gating MOS transistor for one selected row for reading and writing the selected magnetic one-time-programmable memory cells.

38. The magnetic one-time-programmable memory array of claim 37 wherein the column decoder further comprises a sense amplifier that receives read currents when a read voltage is applied to the pairs of bit lines for determining the digital data as programmed into the magnetic one-time-programmable memory array.

39. The magnetic one-time-programmable memory array of claim 38 further comprises at least two columns of reference magnetic one-time-programmable memory cells that are programmed and connected to the column decoder to provide a reference voltage for the sense amplifier.

40. The magnetic one-time-programmable memory array of claim 39 wherein one column of the reference magnetic one-time-programmable memory cells is programmed to have a low resistance of a programmed magnetic one-time-programmable memory cell and a second column has the high resistance of the un-programmed magnetic one-time-programmable memory cell, wherein a current of the two columns is combined such that a reference voltage is provided for the sense amplifier.

41. An integrated circuit constructed on a semiconductor substrate comprising:
at least one magnetic one-time-programmable memory array comprising:
a plurality of magnetic one-time-programmable memory cells arranged in rows and columns, wherein each magnetic one-time-programmable memory cell comprises:
a magnetic tunnel junction (MTJ) device comprising:
a free magnetic layer,
a fixed magnetic layer
a tunnel barrier insulating layer formed between the free magnetic layer and the tunnel barrier insulating layer, and
a pair of electrodes fabricated such that one electrode of the pair of electrodes is connected to the free magnetic layer and a second electrode is connected to the fixed magnetic layer,
wherein a diameter of the MTJ device is chosen such that the tunnel barrier insulating layer is broken down by a program voltage applied across the magnetic one-time-programmable memory cell that is approximately equal to a write voltage for a read/write MRAM memory cell having an equal tunnel barrier insulating layer thickness; and
a gating metal oxide semiconductor (MOS) transistor serially connected to the MTJ device such that a drain of the MOS transistor is connected to one of the two electrodes of the MTJ device;
a plurality of pairs of bit lines wherein a first bit line of the pairs of bit lines is connected to another electrode of the two electrodes of the MTJ device of the magnetic one-time-programmable memory cells of an associated column of the array, a second bit line of the pairs of bit lines is connected to the source of the gating MOS transistor of the magnetic one-time-programmable memory cells of the associated column of the array;
a plurality of word lines wherein each word line is associated with each row of the plurality of magnetic one-time-programmable memory cells such that the gates of gating MOS transistor of each row of the magnetic one-time-programmable memory cells is connected to the word line associated with each row of the magnetic one-time-programmable memory cells; and
at least one magnetic random access memory (MRAM) array configured for having performance and density criteria that match MOS transistor based memory wherein MOS based transistor memory is a static random access memory (SRAM), a dynamic random access memory (DRAM), or flash memory.

42. The integrated circuit of claim 41 wherein the area of the MTJ device is chosen to be approximately 20% smaller in diameter such that the resistance of the MTJ device is approximately 50% greater than an MTJ device of the read/write MRAM memory cell.

43. The integrated circuit of claim 41 wherein the performance criteria for the MOS transistor based memory is a data transfer read and write time of less than 10 ns for the SRAM, of from 10 ns to approximately 100 ns for the DRAM, and greater than 100 ns for the flash memory; wherein the density of the DRAM is very high with a cell area of approximately 0.03 $\mu m^2$ and the density of the SRAM is not a factor, but is made small (approximately 0.03 $\mu m^2$) for the faster read and writes times; wherein the flash memory has a long retention of greater than 10 years or write/erase endurance of approximately 100,000 cycles, which requires a larger cell size of approximately 0.04 $\mu m^2$.

44. The integrated circuit of claim 41 further comprising at least one functional logic unit that is configured to be a computer processor or analog signal processing circuits, or environmental sensing circuits for which the at least one magnetic one-time-programmable memory array and at least one MRAM provides storage for data to be processed by the at least one functional logic unit.

45. A method for forming an integrated circuit constructed on a semiconductor substrate, comprising the steps of:
forming at least one magnetic one-time-programmable memory array is fabricated on the substrate by the steps of:
forming multiple magnetic one-time-programmable memory cells by the steps of:
forming at least one magnetic tunnel junction (MTJ) device on the substrate by the steps of:
fabricating a free magnetic layer,
fabricating a fixed magnetic layer,
fabricating a pair of electrodes, such that one electrode of the pair of electrodes is connected to the free magnetic layer and a second electrode of the pair of electrodes is connected to the fixed magnetic layer,
wherein a diameter of the first MTJ device is chosen such that the tunnel barrier insulating layer is broken down by a program voltage applied across the magnetic one-time-programmable memory cell that is approximately equal to a write voltage for a read/write MRAM memory cell having an equal tunnel barrier insulating layer thickness, and
forming a gating metal oxide semiconductor (MOS) transistor on the substrate, serially connecting the gating MOS transistor to the MTJ device such that one electrode of the pair of electrodes is connected to a drain of the MOS transistor, arranging magnetic one-time-programmable memory cells in rows and columns, forming a plurality of pairs of bit lines, connecting a first bit line of one pair of bit lines to another electrode of the pair of electrode of the first MTJ device of the magnetic one-time-programmable memory cells of an associated column of the array, and connecting a second bit line of the one pair bit lines is connected to the source of the gating MOS transistor of the magnetic one-time-programmable memory cells of the associated column of the array.

46. The method for forming an integrated circuit of claim 45 wherein forming at least one magnetic one-time-programmable memory array further comprises the steps of:

forming a column decoder configured for applying a voltage to selected columns of the magnetic one-time-programmable memory cells for selectively programming the magnetic one-time-programmable memory cells on the selected row;

connecting the column decoder to the pairs of bit lines linked with the columns of the magnetic one-time-programmable memory cells;

forming a row decoder configured for activating the gating MOS transistors for one selected row for reading and writing the selected magnetic one-time-programmable memory cells; and connecting the row decoder to the word lines that are joined to each of the rows of the magnetic one-time-programmable memory cells.

47. The method for forming an integrated circuit of claim 46 further comprising the steps of:

fabricating at least one magnetic random access memory array on the substrate by the steps of:

forming read/write MRAM memory cells arranged in rows and columns, wherein forming each of the read/write MRAM memory cells comprises the steps of:

forming a second MTJ device, forming a gating MOS transistor configured to structurally identical to that of the magnetic one-time-programmable memory cell of the magnetic one time programmable cell, and serially connecting the second MTJ device with the gating MOS transistor.

48. The method for forming an integrated circuit of claim 47 wherein forming the second MTJ device comprises the step of configuring the second MTJ device with a larger area and thus a larger cell size than the first MTJ device.

49. The method for forming an integrated circuit of claim 48 wherein the area of the second MTJ device of the magnetic random access memory cell is chosen to be approximately 20% larger in diameter than the first MTJ device such that the resistance of the MTJ device is approximately 50% smaller than the first MTJ device.

50. The method for forming an integrated circuit of claim 46 further comprises the steps of:

fabricating multiple magnetic random access memory arrays configured such that each of the multiple magnetic random access memory arrays have performance and density criteria that match MOS transistor based memory wherein MOS based transistor memory is a static random access memory (SRAM), a dynamic random access memory (DRAM), or flash memory.

51. The method for forming an integrated circuit of claim 50 wherein the performance criteria for the MOS transistor based memory is a data transfer read and write time of less than 10 ns for the SRAM, of from 10 ns to approximately 100 ns for the DRAM, and greater than 100 ns for the flash memory; wherein the density of the DRAM is very high with a cell area of approximately 0.03 $\mu m^2$ and the density of the SRAM is not a factor, but is made small (approximately 0.03 $\mu m^2$) for the faster read and writes times; wherein the flash memory has a long retention of greater than 10 years or write/erase endurance of approximately 100,000 cycles, which requires a larger cell size of approximately 0.04 $\mu m^2$.

52. The method for forming an integrated circuit of claim 46 further comprising the steps of:

fabricating at least one functional logic unit that is configured to be a computer processor or analog signal processing circuits, or environmental sensing circuits for which the at least one magnetic one-time-programmable memory array and at least one MRAM provides storage for data to be processed by the at least one functional logic unit.

* * * * *